(12) United States Patent
Chou et al.

(10) Patent No.: US 11,062,901 B2
(45) Date of Patent: Jul. 13, 2021

(54) LOW-K DIELECTRIC AND PROCESSES FOR FORMING SAME

(71) Applicant: Taiwan Semiconductor Manufacturing Co., Ltd., Hsinchu (TW)

(72) Inventors: Chia Cheng Chou, Keelung (TW); Po-Cheng Shih, Hsinchu (TW); Li Chun Te, Renwu Township (TW); Tien-I Bao, Taoyuan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/569,791

(22) Filed: Sep. 13, 2019

(65) Prior Publication Data

US 2020/0006059 A1 Jan. 2, 2020

Related U.S. Application Data

(62) Division of application No. 15/944,627, filed on Apr. 3, 2018, now Pat. No. 10,910,216.

(Continued)

(51) Int. Cl.
*H01L 21/02* (2006.01)
*H01L 21/311* (2006.01)
(Continued)

(52) U.S. Cl.
CPC ........ *H01L 21/02274* (2013.01); *C23C 16/30* (2013.01); *H01L 21/02126* (2013.01);
(Continued)

(58) Field of Classification Search
CPC . C23C 16/30; H01L 23/53295; H01L 23/535; H01L 21/02274; H01L 21/02126;
(Continued)

(56) References Cited

U.S. PATENT DOCUMENTS 6,440,838 B1 * 8/2002 Lui ..................... H01L 21/7681
257/E21.579
6,593,225 B1 * 7/2003 Lee ................... H01L 21/76801
257/E21.576

(Continued)

FOREIGN PATENT DOCUMENTS

CN 1644753 A 7/2005
CN 103107092 A 5/2013
(Continued)

*Primary Examiner* — Dale E Page
*Assistant Examiner* — Quovaunda Jefferson
(74) *Attorney, Agent, or Firm* — Slater Matsil, LLP

(57) ABSTRACT

Embodiments described herein relate generally to methods for forming low-k dielectrics and the structures formed thereby. In some embodiments, a dielectric is formed over a semiconductor substrate. The dielectric has a k-value equal to or less than 3.9. Forming the dielectric includes using a plasma enhanced chemical vapor deposition (PECVD). The PECVD includes flowing a diethoxymethylsilane (mDEOS, $C_5H_{14}O_2Si$) precursor gas, flowing an oxygen ($O_2$) precursor gas; and flowing a carrier gas. A ratio of a flow rate of the mDEOS precursor gas to a flow rate of the carrier gas is less than or equal to 0.2.

20 Claims, 10 Drawing Sheets

Related U.S. Application Data

(60) Provisional application No. 62/591,536, filed on Nov. 28, 2017.

(51) Int. Cl.
    *H01L 21/768*     (2006.01)
    *C23C 16/30*     (2006.01)
    *H01L 23/532*     (2006.01)
    *H01L 23/535*     (2006.01)

(52) U.S. Cl.
    CPC .. *H01L 21/02216* (2013.01); *H01L 21/31116* (2013.01); *H01L 21/76805* (2013.01); *H01L 21/76832* (2013.01); *H01L 21/76843* (2013.01); *H01L 21/76871* (2013.01); *H01L 21/76895* (2013.01); *H01L 23/535* (2013.01); *H01L 23/53295* (2013.01); *H01L 23/53209* (2013.01); *H01L 23/53223* (2013.01); *H01L 23/53238* (2013.01); *H01L 23/53252* (2013.01); *H01L 23/53266* (2013.01)

(58) Field of Classification Search
    CPC ......... H01L 21/02216; H01L 21/31116; H01L 21/76805; H01L 21/76832; H01L 21/76843; H01L 21/76871; H01L 21/76895
    USPC .................................................. 438/618, 622
    See application file for complete search history.

(56) References Cited

U.S. PATENT DOCUMENTS

| | | | |
|---|---|---|---|
| 6,713,873 B1 * | 3/2004 | O'Loughlin | H01L 21/3141 |
| | | | 257/758 |
| 8,513,081 B2 | 8/2013 | Guo et al. | |
| 9,040,399 B2 | 5/2015 | Brodsky et al. | |
| 9,105,570 B2 | 8/2015 | Su et al. | |
| 9,761,488 B2 | 9/2017 | Cheng et al. | |
| 2002/0055214 A1 | 5/2002 | Trivedi | |
| 2002/0142579 A1 * | 10/2002 | Vincent | B05D 1/60 |
| | | | 438/623 |
| 2002/0168849 A1 | 11/2002 | Lee et al. | |
| 2003/0211244 A1 | 11/2003 | Li et al. | |
| 2004/0157453 A1 | 8/2004 | Delgadino et al. | |
| 2005/0037153 A1 | 2/2005 | Schmitt et al. | |
| 2005/0230834 A1 | 10/2005 | Schmitt et al. | |
| 2005/0239281 A1 * | 10/2005 | Goodner | H01L 21/76825 |
| | | | 438/629 |
| 2007/0232062 A1 * | 10/2007 | Nogami | H01L 21/76829 |
| | | | 438/638 |
| 2010/0136789 A1 | 6/2010 | Matz et al. | |
| 2012/0178253 A1 * | 7/2012 | Ahn | C25D 1/08 |
| | | | 438/643 |
| 2016/0163842 A1 | 6/2016 | Cao et al. | |
| 2016/0358811 A1 | 12/2016 | Zhou | |

FOREIGN PATENT DOCUMENTS

| | | |
|---|---|---|
| CN | 103545176 A | 1/2014 |
| CN | 103930998 A | 7/2014 |
| EP | 1225194 A2 | 7/2002 |
| KR | 20070012429 A | 1/2007 |
| KR | 20110094205 A | 8/2011 |
| TW | 200403766 A | 3/2004 |
| TW | 201415551 A | 4/2014 |
| TW | 201705364 A | 2/2017 |
| WO | 03095702 A2 | 11/2003 |
| WO | 2007118026 A2 | 10/2007 |

* cited by examiner

LOW-K DIELECTRIC AND PROCESSES FOR FORMING SAME

PRIORITY CLAIM AND CROSS-REFERENCE

This application is a divisional of U.S. patent application Ser. No. 15/944,627, filed on Apr. 3, 2018, entitled "Low-k Dielectric and Processes for Forming Same," which claims the benefit of and priority to U.S. Provisional Patent Application No. 62/591,536, filed on Nov. 28, 2017, entitled "Low-k Dielectric and Processes for Forming Same," each is incorporated herein by reference in its entirety.

BACKGROUND

In the current process of miniaturizing semiconductor devices, low-k dielectric materials are desired as the intermetallization dielectric (IMD) and/or interlayer dielectric (ILD) between conductive interconnects in order to reduce the resistive-capacitive (RC) delay in signal propagation due to capacitive effects. As such, the lower the dielectric constant of the dielectric layer, the lower the parasitic capacitance of adjacent conductive lines and the lower the RC delay of the integrated circuit (IC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
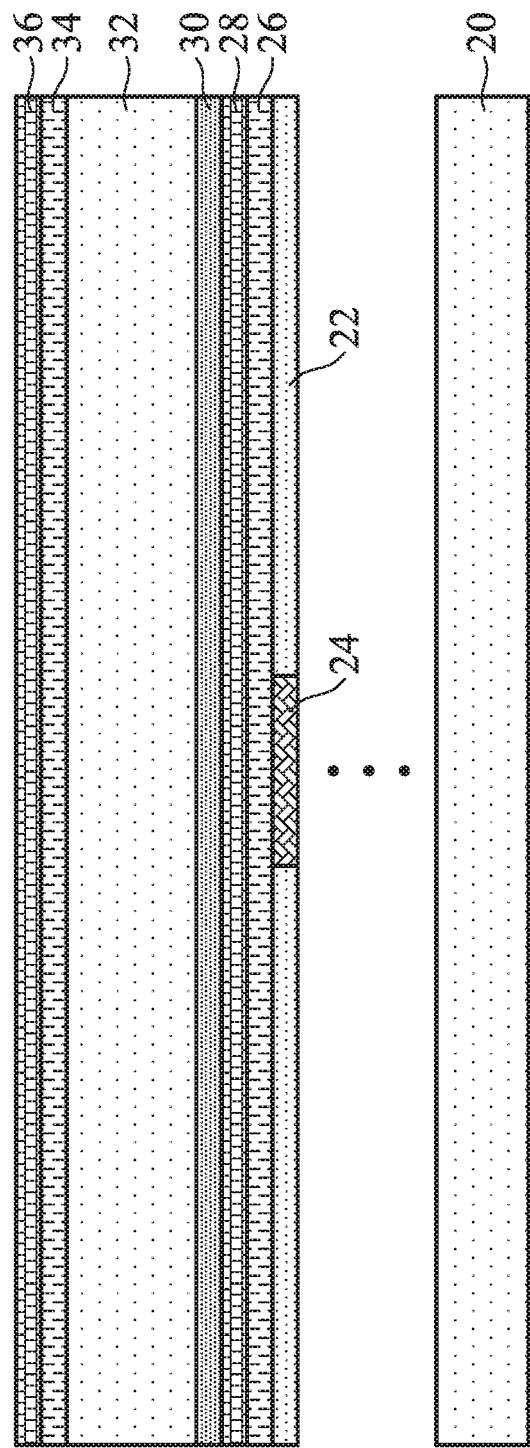
FIGS. 1 through 4 are cross-sectional views of respective intermediate structures at respective stages during an example method for forming one or more dielectric layers with a conductive feature formed therein in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate generally to one or more methods for forming a dielectric structure, such as a low-k dielectric layer (e.g., an extreme low-k dielectric layer), in semiconductor processing. Generally, a low-k dielectric layer may be implemented having a dielectric constant value (k-value) equal to or less than about 3.9 (e.g., in a range from about 2.0 to about 3.9), and more particularly, such as equal to or less than about 3.5 (e.g., in a range from about 2.0 to about 3.5), and even more particularly, such as equal to or less than about 3.3 (e.g., in a range from about 2.0 to about 3.3). The low-k dielectric layer may be implemented as a variety of structures, and in illustrated examples herein, a low-k dielectric layer is implemented as an interlayer dielectric (ILD) and/or an intermetallization dielectric (IMD) in which a conductive feature is formed. A low-k dielectric layer can be deposited using a chemical vapor deposition (CVD), such as a plasma enhanced CVD (PECVD), in which a diethoxymethylsilane (mDEOS, $C_5H_{14}O_2Si$) precursor gas and oxygen ($O_2$) precursor gas are used, along with a carrier gas. Flow rates of the mDEOS and oxygen can be relatively low, while a flow rate of the carrier gas can be high. The low-k dielectric layer can have increased Si—C—Si bonding, which can increase properties of the low-k dielectric layer. Various advantages may be achieved by implementing the low-k dielectric layer, some of which are described below.

Various modifications are discussed with respect to disclosed embodiments; however, other modifications may be made to disclosed embodiments while remaining within the scope of the subject matter. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1 through 4 illustrate cross-sectional views of respective intermediate structures at respective stages during an example method for forming one or more dielectric layers with a conductive feature formed therein in accordance with some embodiments. FIG. 1 illustrates a semiconductor substrate 20. The semiconductor substrate 20 may be or include a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on or is a substrate, typically a silicon or glass substrate. Other substrates, such as a multi-layered or gradient substrate may also be used. In some embodiments, the semiconductor material of the semiconductor substrate 20 may include an elemental semiconductor such as silicon (Si) or germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

Various devices may be on the semiconductor substrate 20. For example, the semiconductor substrate 20 may include Field Effect Transistors (FETs), such as Fin FETs (FinFETs), planar FETs, vertical gate all around FETs (VGAA FETs), or the like; diodes; capacitors; inductors; and other devices. Devices may be formed wholly within the semiconductor substrate 20, in a portion of the semiconductor substrate 20 and a portion of one or more overlying layers, and/or wholly in one or more overlying layers, for example. Processing described herein may be used to form and/or to interconnect the devices to form an integrated circuit (IC). The integrated circuit can be any circuit, such as for an application specific integrated circuit (ASIC), a processor, memory, or other circuit.

FIG. 1 illustrates at least a portion of a structure 22 and a conductive feature 24 in the structure 22 as an example. The structure 22 can be, for example, a portion of the semiconductor substrate 20, and the conductive feature 24 can be a source/drain region of a transistor (e.g., FinFET) in the semiconductor substrate 20 or another conductive region of the semiconductor substrate 20, such as a p-type or n-type doped region of the semiconductor substrate 20. In another example, the structure 22 can include respective portions of a first interlayer dielectric (ILD), contact etch stop layer (CESL), and gate spacers over the semiconductor substrate 20, and the conductive feature 24 is a gate electrode of a transistor that is over the semiconductor substrate 20. In another example, the structure 22 includes or is a second ILD over the semiconductor substrate 20, and the conductive feature 24 is, e.g., a contact or a plug to a source/drain region in the semiconductor substrate 20 and/or gate structure on the semiconductor substrate 20. In a further example, the structure 22 includes or is an intermetallization dielectric (IMD) over the semiconductor substrate 20, and the conductive feature 24 is a metallization pattern, e.g., a metal line and/or via. Hence, a low-k dielectric layer 32 described herein below can be implemented as an ILD and/or as an IMD. Further, processing described below may be implemented in Front End Of the Line (FEOL), Middle End Of the Line (MEOL), and/or Back End Of the Line (BEOL).

As will become apparent from subsequent description, the dielectric structure 22 may be or include a low-k dielectric layer or structure, or even further, may include an extreme low-k dielectric layer or structure. By implementing low-k dielectrics, and further, extreme low-k dielectrics, in various layers or structures from adjacent or proximate to the semiconductor substrate 20 through a topmost IMD, parasitic capacitances of interconnections that form part of an IC can be decreased, and hence, resistance-capacitance (RC) delay of the IC can be decreased. A decreased RC delay can improve device operational speed.

In other examples, processes for forming a low-k dielectric as described below can be implemented to form other dielectric structures. For example, the processes described below can be implemented in forming a layer used to form gate spacers or a CESL. Other dielectric structures may be formed using an implementation of a process described below.

A first etch stop sub-layer 26 is formed over the structure 22 and conductive feature 24, and a second etch stop sub-layer 28 is formed over the first etch stop sub-layer 26. The first etch stop sub-layer 26 and the second etch stop sub-layer 28 form an etch stop for subsequent etching to form an interconnect, such as including a via and/or line, in an overlying dielectric layer. Generally, an etch stop can provide a mechanism to stop an etch process when forming, e.g., vias. An etch stop may be formed of a dielectric material having a different etch selectivity from adjacent layers or components. In an example, the first etch stop sub-layer 26 is or includes aluminum nitride (AlN), aluminum oxide (AlOX or $Al_2O_3$), or another material, and the second etch stop sub-layer 28 is or includes oxygen-doped silicon carbide (SiC:O), silicon oxycarbide (SiOC), or another material. Each of the first etch stop sub-layer 26 and the second etch stop sub-layer 28 can be deposited by chemical vapor deposition (CVD), physical vapor deposition (PVD), or another deposition technique. A thickness of the first etch stop sub-layer 26 can be in a range from about 1 nm to about 5 nm, and a thickness of the second etch stop sub-layer 28 can be in a range from about 3 nm to about 10 nm. Different etch stop schemes may be implemented in the place of or in addition to the etch stop illustrated. For example, a single layer etch stop may be implemented, or more sub-layers may be implemented for an etch stop. Further, other example materials may be implemented as an etch stop, such as silicon nitride, silicon carbon nitride, silicon oxynitride, and other materials.

An adhesion layer 30 is formed over the second etch stop sub-layer 28. In some examples, the adhesion layer 30 can be omitted. The adhesion layer 30 can be formed to provide an interface between the etch stop and an overlying dielectric layer that permits good adhesion with the etch stop and the overlying dielectric layer. The adhesion layer 30 can be an oxygen-containing dielectric layer, such as silicon oxide (SiO), silicon oxycarbide (SiOC), or another oxide-like material. In some examples, the adhesion layer 30 can be deposited using CVD, plasma enhanced CVD (PECVD), or another deposition technique. A thickness of the adhesion layer 30 can be in a range from about 0.1 nm to about 10 nm. Other materials and/or layers may be implemented as an adhesion layer.

In an example, the adhesion layer 30 can be silicon dioxide ($SiO_2$) and can be deposited using CVD. The CVD may use precursors including silane ($SiH_4$) or tetraethoxysilane (TEOS, $SiC_8H_{20}O_4$), and oxygen ($O_2$). The CVD may also use a carrier gas, such as helium (He). A flow rate of the silane precursor gas or TEOS precursor gas can be in a range from about 10 sccm to about 300 sccm; a flow rate of the oxygen precursor gas can be in a range from about 50 sccm to about 200 sccm; and a flow rate of the carrier gas can be in a range from about 500 sccm to about 5,000 sccm. A pressure of the CVD can be in a range from about 5 Torr to about 10 Torr. A temperature of the CVD process can be in a range from about 300° C. to about 400° C.

In another example, the adhesion layer 30 can be silicon oxycarbide (SiOC) and can be deposited using PECVD. The PECVD may use precursors including diethoxymethylsilane (mDEOS, $C_5H_{14}O_2Si$) and oxygen ($O_2$). The PECVD may also use a carrier gas, such as helium (He). A flow rate of the mDEOS precursor gas can be equal to or less than about 600 sccm; a flow rate of the carrier gas (e.g., He) can be greater than or equal to about 4,000 sccm; and a flow rate of the oxygen precursor gas can be in a range from about 10 sccm to about 200 sccm, such as about 50 sccm. A ratio of the flow rate of the mDEOS precursor gas to the flow rate of the carrier gas can be equal to or less than about 0.5. A ratio of the flow rate of the mDEOS precursor gas to the flow rate of the oxygen precursor gas can be equal to or less than about 20. A pressure of the PECVD can be less than 12 Torr, such as equal to or less than about 9 Torr. A power of the plasma generator of the PECVD can be greater than 300 W, such as in a range from about 300 W to about 1,200 W, such as about 750 W. A temperature of the PECVD process can be greater than or equal to about 200° C., such as in a range from about 200° C. to about 400° C., such as about 260° C.

A low-k dielectric layer 32 is formed over the adhesion layer 30. The low-k dielectric layer 32 may be an extreme low-k (ELK) dielectric layer. For example, the low-k dielectric layer 32 can have a k-value equal to or less than about 3.9 (e.g., in a range from about 2.0 to about 3.9), and more particularly, such as equal to or less than about 3.5 (e.g., in a range from about 2.0 to about 3.5), and even more particularly, such as equal to or less than about 3.3 (e.g., in a range from about 2.0 to about 3.3). In some examples, the low-k dielectric layer 32 is or includes silicon oxycarbide (SiOC). The low-k dielectric layer 32 can be deposited using plasma-enhanced CVD (PECVD), for example. The PECVD may use precursors including diethoxymethylsilane (mDEOS, $C_5H_{14}O_2Si$) and oxygen ($O_2$). The PECVD may also use a carrier gas, such as helium (He). A flow rate of the mDEOS precursor gas can be equal to or less than about 600 sccm; a flow rate of the carrier gas (e.g., He) can be greater than or equal to about 3,000 sccm; and a flow rate of the oxygen precursor gas can be in a range from about 10 sccm to about 100 sccm, such as about 50 sccm. A ratio of the flow rate of the mDEOS precursor gas to the flow rate of the carrier gas can be equal to or less than about 0.2. A ratio of the flow rate of the mDEOS precursor gas to the flow rate of the oxygen precursor gas can be equal to or less than about 30. A pressure of the PECVD can be equal to or less than 9.5 Torr, such as equal to or less than about 9 Torr. A power of the plasma generator of the PECVD can be equal to or greater than 350 W, such as in a range from about 400 W to about 1,200 W, such as about 750 W. A temperature of the PECVD process can be greater than or equal to about 260° C., such as in a range from about 260° C. to about 400° C. A thickness of the low-k dielectric layer 32 can be in a range from about 20 nm to about 100 nm.

The low-k dielectric layer 32 formed according to the PECVD process described above can be silicon oxycarbide (SiOC) with a k-value equal to or less than about 3.9 (e.g., in a range from about 2.0 to about 3.9), and more particularly, such as equal to or less than about 3.5 (e.g., in a range from about 2.0 to about 3.5), and even more particularly, such as equal to or less than about 3.3 (e.g., in a range from about 2.0 to about 3.3). The low-k dielectric layer 32 formed according to the PECVD process described above can have a concentration of carbon in a range from about 5 atomic percent (at. %) to about 30 at. %, a concentration of oxygen in a range from about 40 at. % to about 55 at. %, and a concentration of silicon in a range from about 30 at. % to about 40 at. %. In some examples, the concentration of oxygen can be greater than the concentration of silicon, and the concentration of silicon can be greater than the concentration of carbon.

Figure 5:
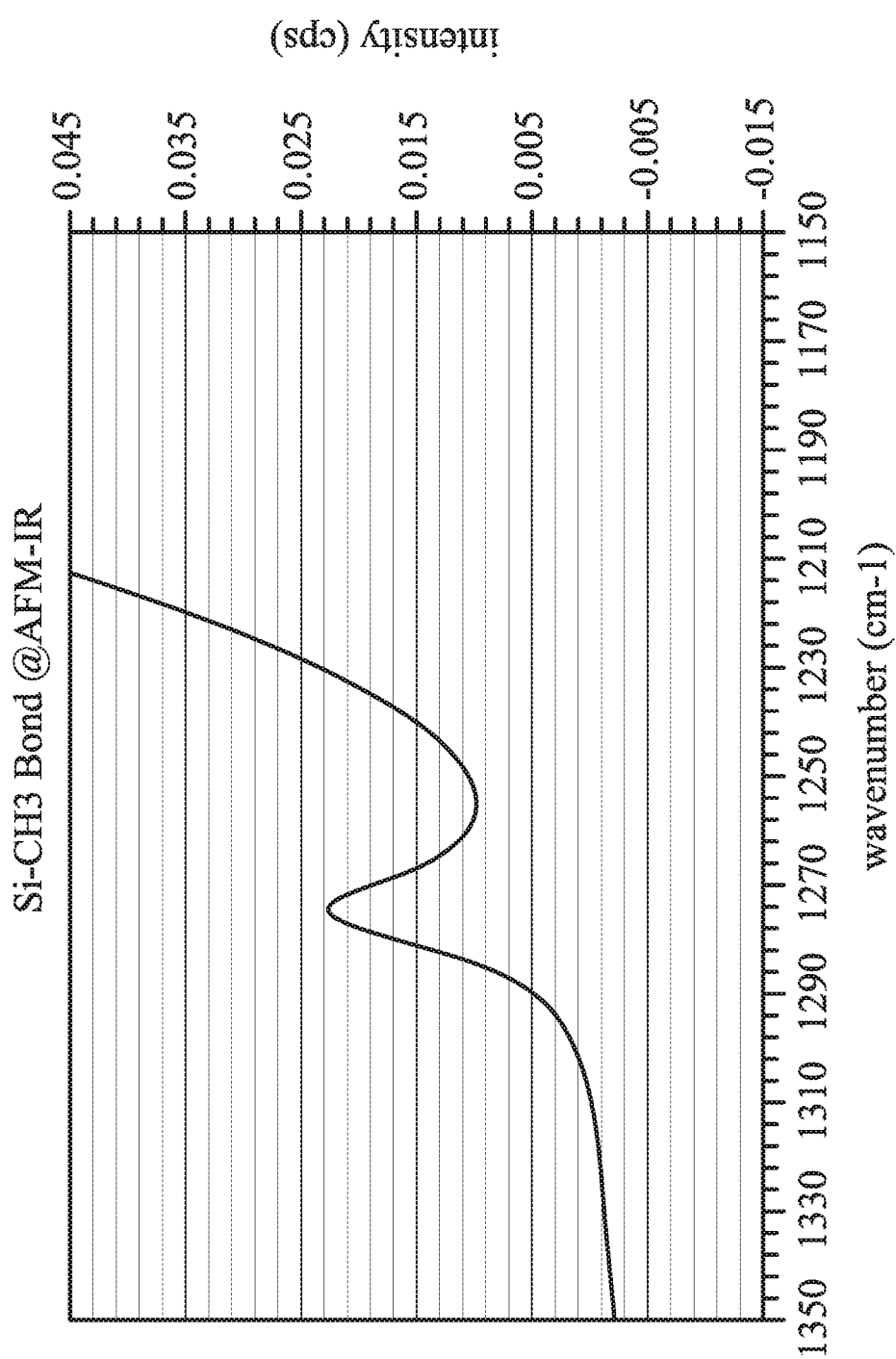
FIG. 5 is a graph illustrating an atomic force microscope infrared spectroscopy (AFM-IR) analysis of a sample for Si—$CH_3$ bonding in accordance with some embodiments.
Figure 6:
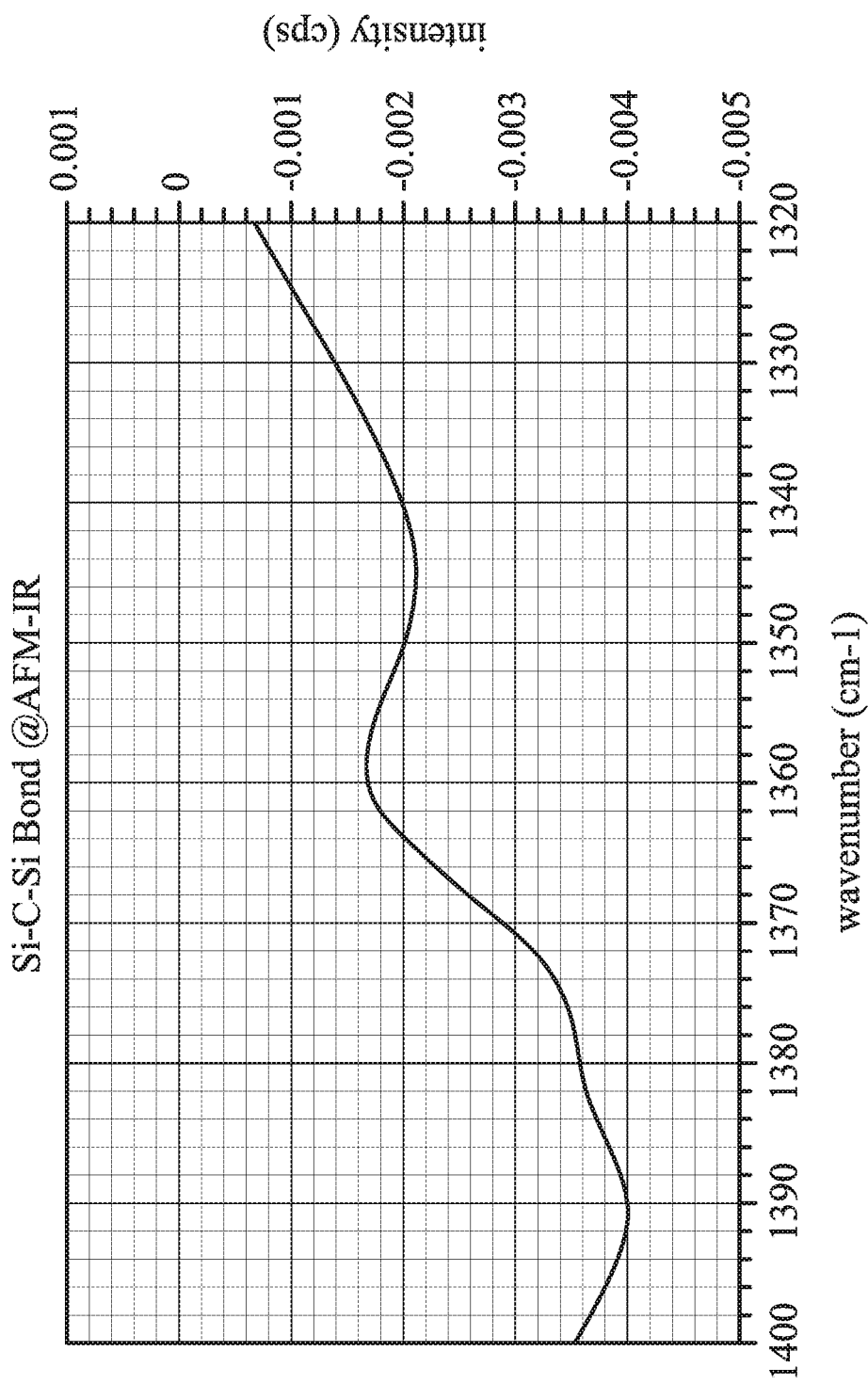
FIG. 6 is a graph illustrating an AFM-IR analysis of a sample for Si—C—Si bonding in accordance with some embodiments.

The low-k dielectric layer 32 formed according to the PECVD process described above can have enhanced properties. For example, a hardness of the low-k dielectric layer 32 can be improved relative to previous low-k dielectrics. A hardness of the low-k dielectric layer 32 can be in a range from about 3 GPa to about 10 GPa. The improved hardness may result from increased Si—C—Si bonding and decreased Si—$CH_3$ bonding in the low-k dielectric layer 32. It is believed that Si—C—Si bonding is stronger than Si—$CH_3$ bonding. For example, Si—C—Si may form a bridge between atoms and/or molecules, whereas Si—$CH_3$ bonding may form a terminal to which another atom and/or molecule may not bond. By forming more bridges (e.g., increasing Si—C—Si bonding) and/or forming fewer terminals (e.g., decreasing Si—$CH_3$ bonding) can result in the improved hardness because the material contains more bonds between atoms and/or molecules. A concentration of Si—C—Si bonds in the low-k dielectric layer 32 can be in a range from about 8% to about 50%, such as about 30%, and a concentration of Si—$CH_3$ bonds in the low-k dielectric layer 32 can be less than about 20% or in a range from about 5% to about 40%, which may be measured by atomic force microscope infrared spectroscopy (AFM-IR). FIGS. 5 and 6 are graphs illustrating AFM-IR analyses of a sample for Si—$CH_3$ bonding and Si—C—Si bonding, respectively, in accordance with some embodiments. The Si—$CH_3$ bonding in FIG. 5 illustrates a 66.67% or more decrease in Si—$CH_3$ bonding in a low-k dielectric layer 32 as described herein relative to another low-k dielectric layer. The Si—C—Si bonding in FIG. 6 illustrates an approximately 600% increase in Si—C—Si bonding in a low-k dielectric layer 32 as described herein relative to another low-k dielectric layer.

As apparent from the above description, the low-k dielectric layer 32 does not implement a porogen material during formation and does not have pores as formed. Dielectric layers that have pores can be mechanically weak and susceptible to cracking and other failures. The low-k dielectric layer 32 can have increased mechanical properties, such as hardness, that may not be possible if the low-k dielectric layer 32 included pores.

A dielectric cap layer 34 is formed over the low-k dielectric layer 32. The dielectric cap layer 34 may, for example, protect the low-k dielectric layer 32 during subsequent processing. The dielectric cap layer 34 can be a nitrogen-free anti-reflection layer (NFARL) in some examples. In some examples, the NFARL can be or include carbon-doped silicon dioxide (e.g., $SiO_2$:C), wherein a concentration of the carbon can be in a range from about 1% to about 5%, such as about 2%. The carbon-doped silicon dioxide of the NFARL can be deposited using CVD with silane ($SiH_4$) and carbon dioxide ($CO_2$) precursor gases, which may further use a carrier gas, such as helium (He). The NFARL can suppress light reflections from underlying layers during subsequent patterning of a photoresist overlying the NFARL, for example. The dielectric cap layer 34 can be another oxide. For example, the oxide can be a silicon oxide deposited using PECVD or another CVD technique using tetraethoxysilane (TEOS, $SiC_8H_{20}O_4$) and oxygen ($O_2$) or ozone ($O_3$) as precursor gases, which may further use a carrier gas, such as helium (He). A thickness of the dielectric cap layer 34 can be in a range from about 10 nm to about 40 nm. Other materials, which may be formed by other processes, may be implemented as the dielectric cap layer 34.

A metal cap layer 36 is formed over the dielectric cap layer 34. The metal cap layer 36 can be titanium nitride (TiN), titanium oxide (TiO), boron nitride (BN), or another material. The metal cap layer 36 can be deposited using CVD, PVD, or another deposition technique. A thickness of the metal cap layer 36 can be in a range from about 5 nm to about 30 nm. The metal cap layer 36, alone or with the dielectric cap layer 34, can act as a hard mask during subsequent patterning of underlying layers. Other materials, which may be formed by other processes, may be implemented as the metal cap layer 36.

Figure 2:
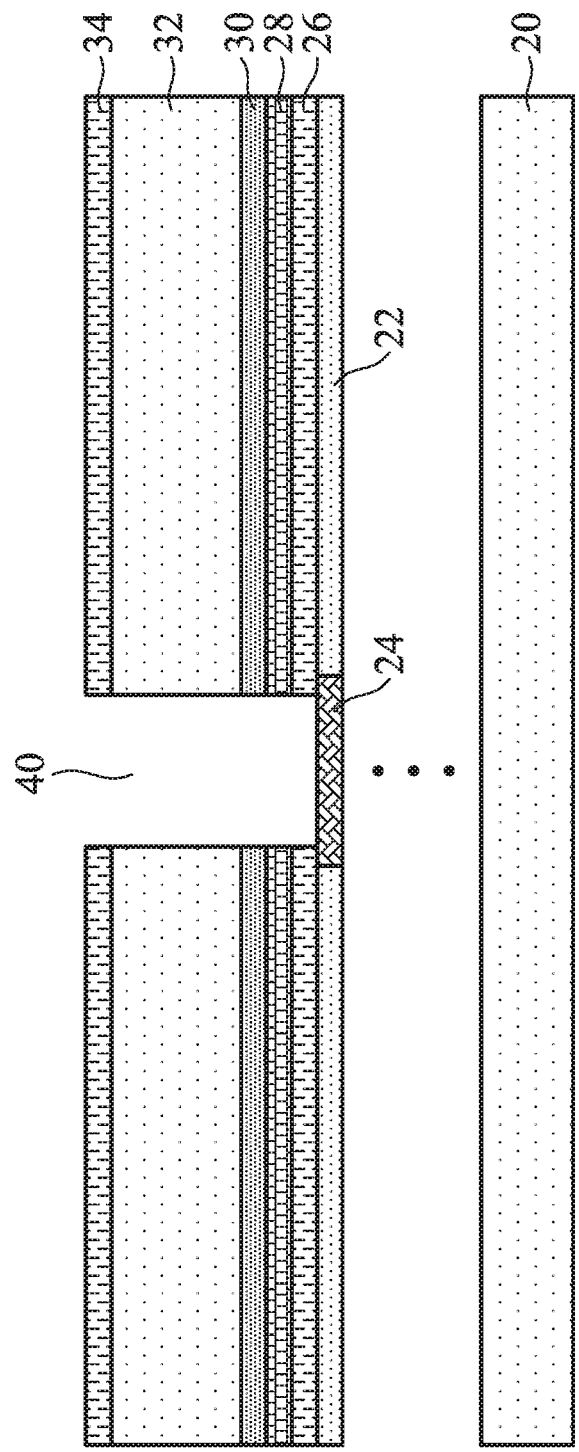

FIG. 2 illustrates the formation of an opening 40 through the dielectric cap layer 34, low-k dielectric layer 32, adhesion layer 30, second etch stop sub-layer 28, and first etch stop sub-layer 26 to the conductive feature 24. The opening 40 can include a trench and/or a via opening, for example. The opening 40 can be formed using photolithography and etching processes. For example, a photo resist can be formed on the metal cap layer 36, such as by using spin-on coating, and patterned with a pattern corresponding to the opening 40 by exposing the photo resist to light using an appropriate photomask. Exposed or unexposed portions of the photo resist may then be removed depending on whether a positive or negative resist is used. The pattern of the photo resist may then be transferred to the metal cap layer 36 and dielectric cap layer 34, such as by using one or more suitable etch processes. The photo resist can be removed in an ashing or wet strip process, for example. With the pattern transferred to the metal cap layer 36 and dielectric cap layer 34, the metal cap layer 36 and dielectric cap layer 34 can be used as a hardmask to transfer the pattern to the low-k dielectric layer 32, adhesion layer 30, second etch stop sub-layer 28, and first etch stop sub-layer 26 to form the opening 40, which may be by using one or more suitable etch processes. The etch processes may include a reactive ion etch (RIE), neutral beam etch (NBE), inductive coupled plasma (ICP) etch, the like, or a combination thereof. The etch processes may be anisotropic.

The etch processes for etching different layers may have different chemistries based on the selectivity of the materials to be etched, as a person having ordinary skill in the art will readily understand. Based on the different materials and different selectivity, the second etch stop sub-layer 28 and first etch stop sub-layer 26 can be an etch stop for one or more of the etch processes. As an example, the low-k dielectric layer 32 may be etched using a dry plasma etch process using a fluorocarbon gas, such as octafluorocyclobutane ($C_4F_8$), tetrafluoromethane ($CF_4$), hexafluorocyclobutene ($C_4F_6$), the like, or a combination thereof. As illustrated in FIG. 2, the metal cap layer 36 may be consumed in one or more of the etch processes implemented to form the opening 40.

In some examples, multiple photo resist patterning and etching steps may be performed to form the opening 40, such as may be performed in a dual damascene process. For example, a photo resist can be formed on the metal cap layer 36 and patterned with a pattern corresponding to a via opening of the opening 40. One or more etch processes may then be used to etch at least partially through the low-k dielectric layer 32 to transfer the pattern of the via opening to the low-k dielectric layer 32. Then, a photo resist can be formed on the metal cap layer 36 and patterned with a pattern corresponding to a trench of the opening 40, where the pattern of the trench overlays the via opening of the opening 40. One or more etch processes may then be used to etch through the low-k dielectric layer 32, adhesion layer 30, second etch stop sub-layer 28, and first etch stop sub-layer 26 to continue transferring the pattern of the via opening to those layers and to transfer the pattern of the trench to the low-k dielectric layer 32. Other processes may be used to form the opening 40.

Figure 3:
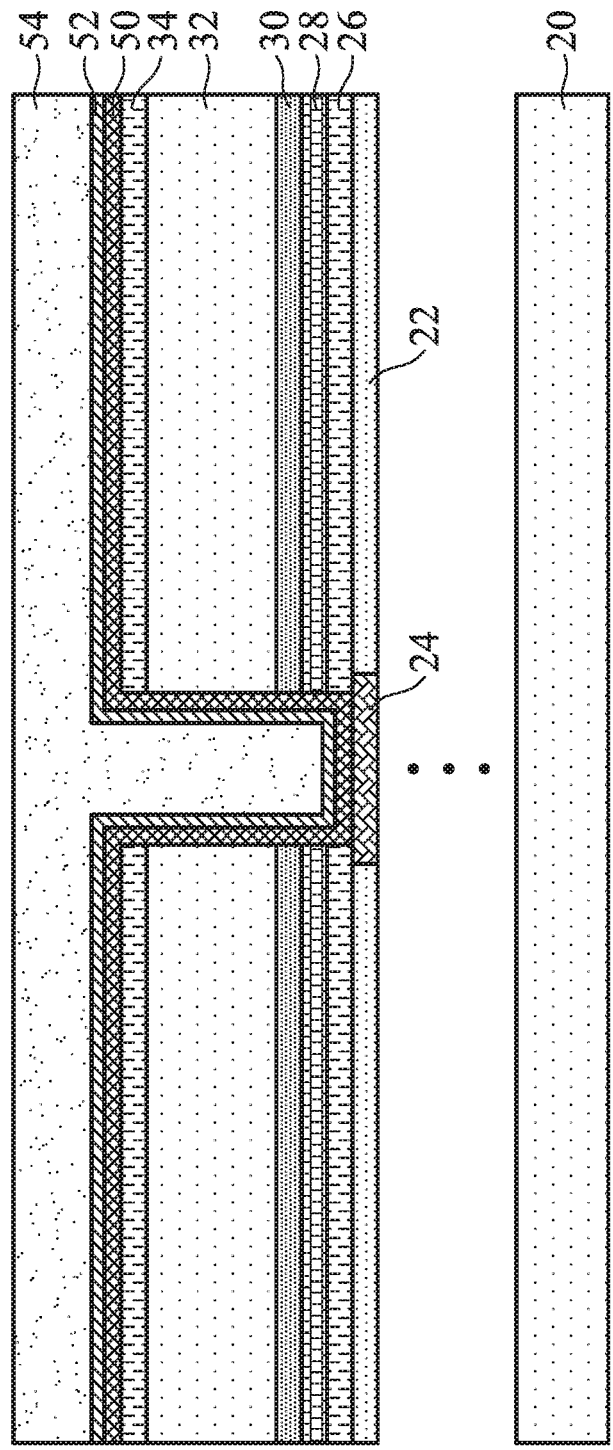

FIG. 3 illustrates the formation of a barrier layer 50 in the opening 40 and on a top surface of the dielectric cap layer 34, a seed layer 52 on the barrier layer 50, and a conductive fill material 54 (e.g., a metal) on the seed layer 52. The barrier layer 50 is formed conformally in the opening 40 and on the top surface of the dielectric cap layer 34. The seed layer 52 is then formed conformally on the barrier layer 50. The conductive fill material 54 is formed on the seed layer 52 (wherein the seed layer 52 can be and/or have nucleation sites for deposition of the conductive fill material 54) and filling the opening 40. The barrier layer 50 may be or comprise titanium nitride, titanium oxide, tantalum nitride, tantalum oxide, the like, or a combination thereof, and may be deposited by CVD, ALD, or another deposition technique. The seed layer 52 may be or comprise copper, aluminum, silver, gold, titanium, tungsten, another suitable material, an alloy thereof, or a combination thereof, and may be deposited by PVD, CVD, or another deposition technique. The conductive fill material 54 may be or comprise copper, aluminum, tungsten, cobalt, ruthenium, gold, silver, an alloy thereof, the like, or a combination thereof, and may be deposited by electroless plating, PVD, CVD, or another deposition technique.

Figure 4:
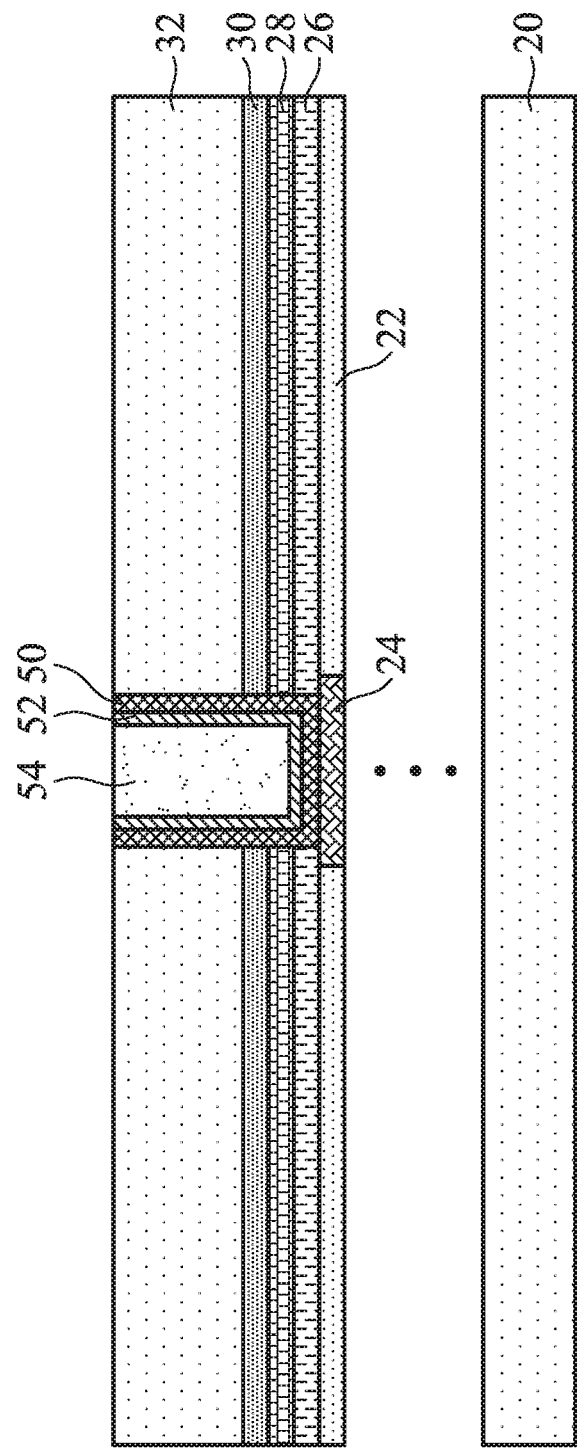

FIG. 4 illustrates the removal of excess conductive fill material 54, seed layer 52, and barrier layer 50, and the removal of the dielectric cap layer 34. A planarization process, such as a chemical mechanical polish (CMP), may be used to remove the excess conductive fill material 54, seed layer 52, and barrier layer 50, and the dielectric cap layer 34. Hence, a metallization pattern comprising the conductive fill material 54, seed layer 52, and barrier layer 50 can be formed in the opening 40 and with a top surface coplanar with a top surface of the low-k dielectric layer 32 as illustrated in FIG. 4.

FIGS. 3 and 4 illustrate an example process for forming a metallization pattern in the opening 40. Other processes and/or materials may be implemented. For example, the barrier layer 50 may be omitted if the conductive fill material 54 is not likely to diffuse significantly into the low-k dielectric layer 32, such as when the conductive fill material 54 is titanium, tungsten, cobalt, or ruthenium. Further, the seed layer 52 may be omitted based on the deposition technique implemented to deposit the conductive fill material 54. For example, a selective deposition process may use the exposed portion of the top surface of the conductive feature 24 (e.g., a metal surface) to selectively deposit the conductive fill material 54 in the opening 40 (e.g., growing from the metal surface) without depositing the conductive fill material 54 on the top surface of the dielectric cap layer 34. For example, a selective CVD may deposit ruthenium on the conductive feature 24 in the opening 40 and not significantly nucleate on a dielectric surface. Similarly, an electroless plating may deposit cobalt on the conductive feature 24 in the opening 40. Hence, the metallization pattern can comprise the conductive fill material 54 with or without the barrier layer 50 and/or the seed layer 52.

Further, multiple deposition processes may be implemented to deposit different or the same conductive fill material 54 in different portions of the opening 40. For example, a via in a via opening of the opening 40 may be, for example, cobalt or ruthenium deposited by a selective deposition process, and a line in a trench of the opening 40 may be, for example, cobalt, tungsten, or copper deposited by another deposition process.

Other processes and/or materials may be used to form the metallization pattern in the opening 40. In any processes for forming the metallization pattern, any excess material and the dielectric cap layer 34 may be removed by a planarization process, such as a CMP, as described with respect to FIG. 4 to form a top surface of the metallization pattern coplanar with the top surface of the low-k dielectric layer 32.

After the metallization pattern is formed in the low-k dielectric layer 32, the low-k dielectric layer 32 may have a consistent concentration of carbon throughout the low-k dielectric layer 32. Other dielectric layers may be susceptible to carbon depletion as a result of plasma induced damage, such as resulting from a plasma-based etch process. For example, for some dielectric layers, a plasma-based etch process may etch an opening in the dielectric layer, and in a region of the dielectric layer at a sidewall of the opening, the dielectric layer may have a reduced carbon concentration compared to another region of the dielectric layer away from the opening as a result of plasma induced carbon depletion. In some examples, the low-k dielectric layer 32 is more robust and less susceptible to plasma induced carbon depletion as a result of the etch processes that form the opening 40. Hence, in those examples, the low-k dielectric layer 32 can have a consistent concentration of carbon from each sidewall of the opening 40 (and metallization pattern) to a region of the low-k dielectric layer 32 disposed a distance away from the respective sidewall.

Figure 7:
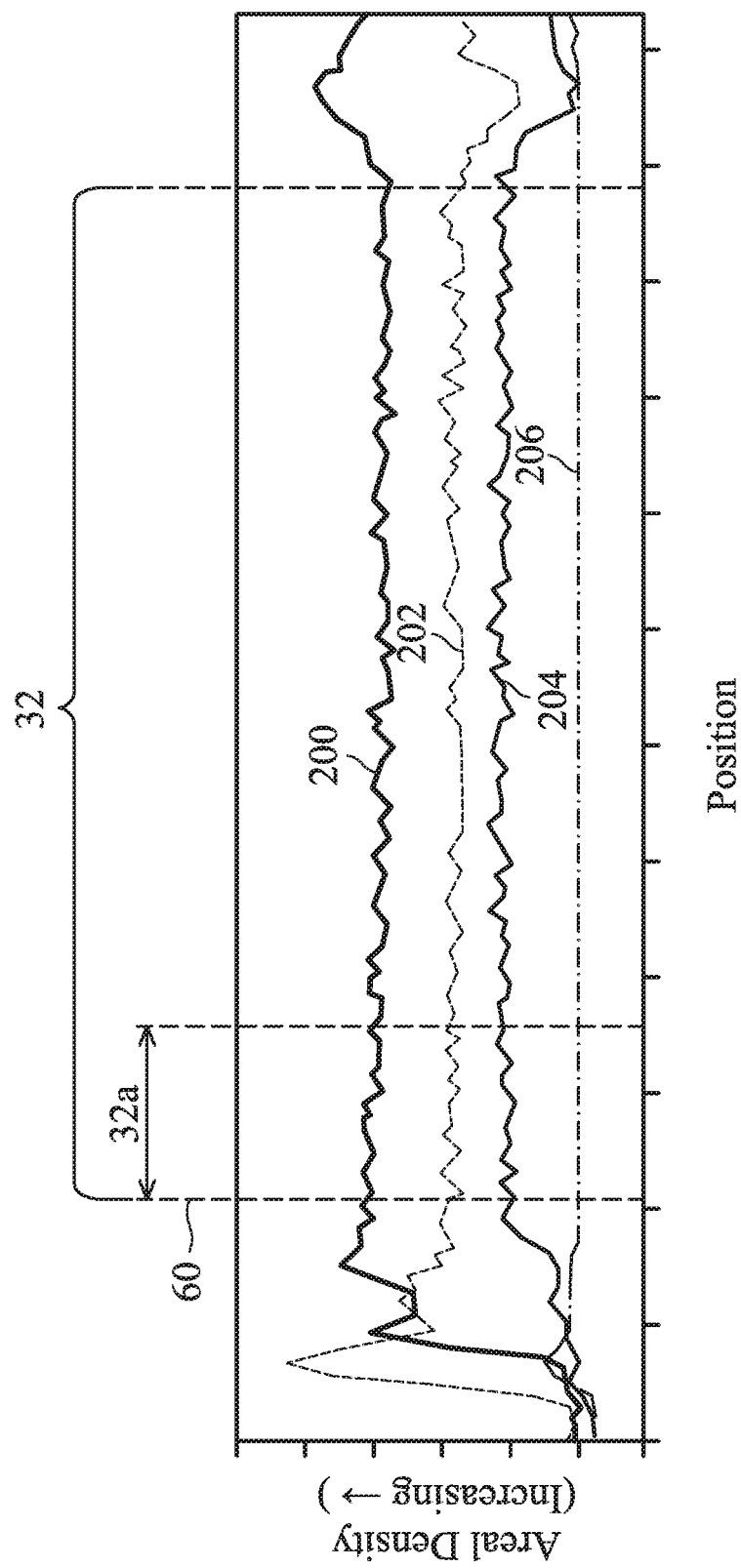
FIG. 7 is a graph illustrating areal densities of various elements in a low-k dielectric layer in accordance with some embodiments.

FIG. 7 is a graph illustrating areal densities of various elements in the low-k dielectric layer 32 in accordance with some embodiments. The graph illustrates relative areal densities as a function of position within the low-k dielectric layer 32. The low-k dielectric layer 32 has a surface 6o that is proximate a plasma during a plasma-based process, such as a plasma-based etch process. The graph illustrates a first areal density profile 200 of oxygen, a second areal density profile 202 of silicon, a third areal density profile 204 of carbon, and a fourth areal density profile 206 of nitrogen. As illustrated, the third areal density profile 204 of carbon is consistent throughout the low-k dielectric layer 32, and more particularly, in an exterior region 32a of the low-k dielectric layer 32 (e.g., from the surface 6o towards an interior of the low-k dielectric layer 32). As a comparison, in other dielectric layers as a result of plasma induced carbon depletion, a concentration of carbon at a surface of the dielectric layer (e.g., which would correspond to the surface 60) would be a lowest concentration in the dielectric layer, and the concentration of carbon would increase from the surface of the dielectric layer towards an interior of the dielectric layer (e.g., which would correspond to a region outside of the exterior region 32a of the low-k dielectric layer 32).

As indicated previously, the low-k dielectric layer 32 may be formed over the adhesion layer 30, and in some examples, the low-k dielectric layer 32 and adhesion layer 30 may be deposited using PECVD that uses an mDEOS precursor gas and an oxygen precursor gas. The ratio of the flow rate of the mDEOS precursor gas to the flow rate of the oxygen precursor gas in depositing the low-k dielectric layer 32 is greater than the ratio of the flow rate of the mDEOS precursor gas to the flow rate of the oxygen precursor gas in depositing the adhesion layer 30. Conversely, the flow rate of the oxygen precursor gas relative to the flow rate of the mDEOS precursor gas is greater in depositing the adhesion layer 30 than in depositing the low-k dielectric layer 32. Hence, the low-k dielectric layer 32 and the adhesion layer 30 may both be silicon oxycarbide (SiOC), and a concentration of oxygen in the adhesion layer 30 is greater than a concentration of oxygen in the low-k dielectric layer 32. In this situation, the adhesion layer 30 may provide more Si—O bonding with the underlying second etch stop sublayer 28 and with the overlying low-k dielectric layer 32.

Processing can continue by repeating the processes described with respect to FIGS. 1 through 4 to create, for example, one or more IMDs over the low-k dielectric layer 32. For example, the processing can be repeated as described above under the assumption that the low-k dielectric layer 32 is the dielectric structure 22 and that the metallization pattern (comprising at least the conductive fill material 54) is the conductive feature 24. The processing of FIGS. 1 through 4 can be repeated any number of times.

Figure 8:
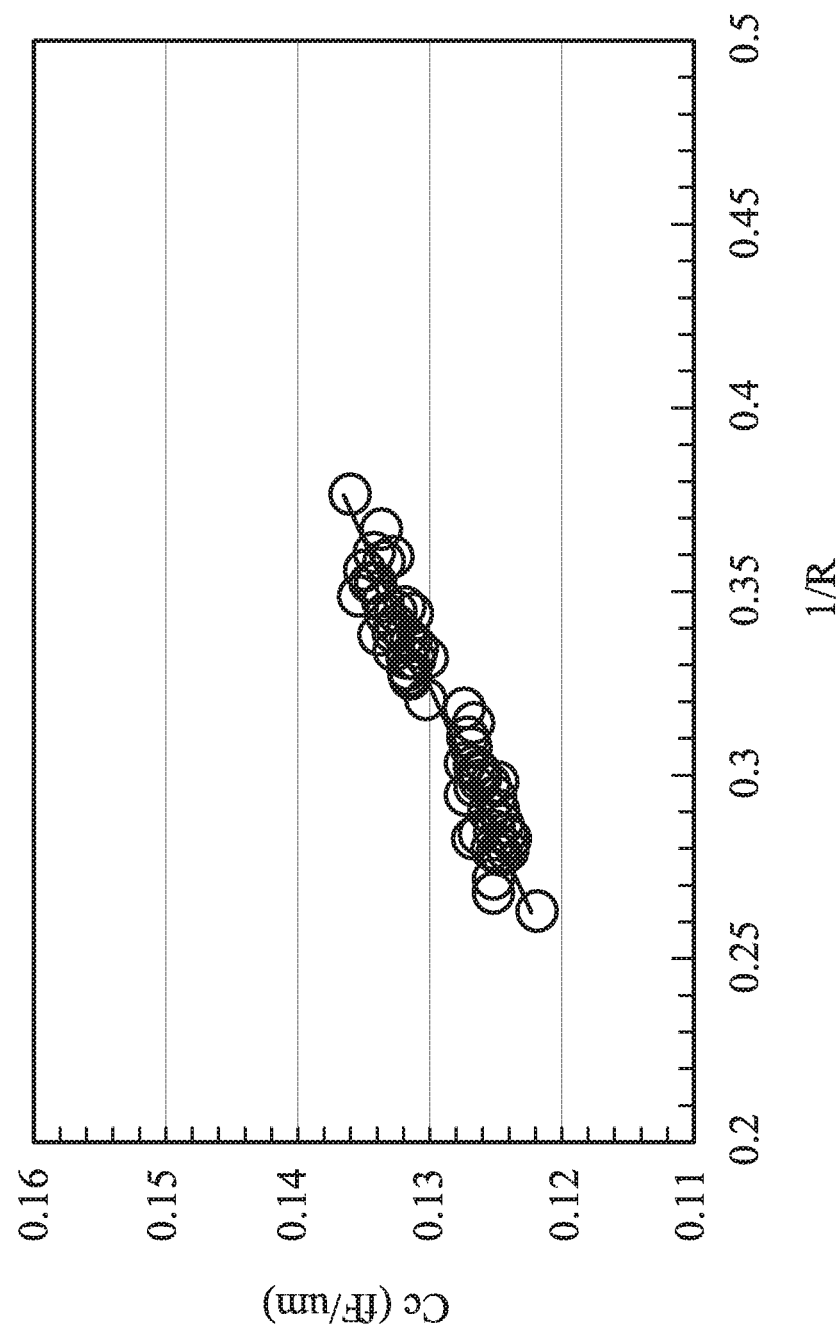
FIG. 8 is a graph illustrating capacitance per distance as a function of inverse resistance for a number of samples of a low-k dielectric in accordance with some embodiments.
Figure 9:
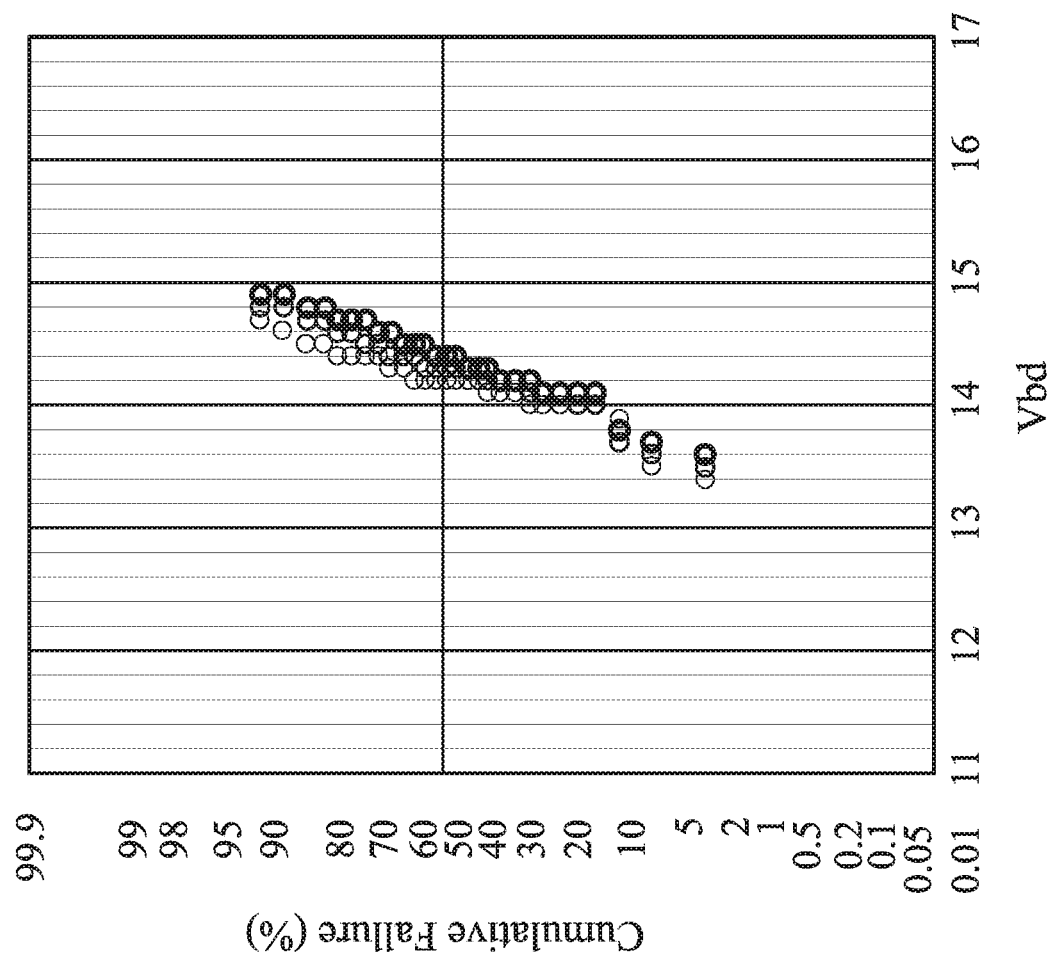
FIG. 9 is a graph illustrating failure rates of samples as a function of voltage breakdown (VBD) in accordance with some embodiments.
Figure 10:
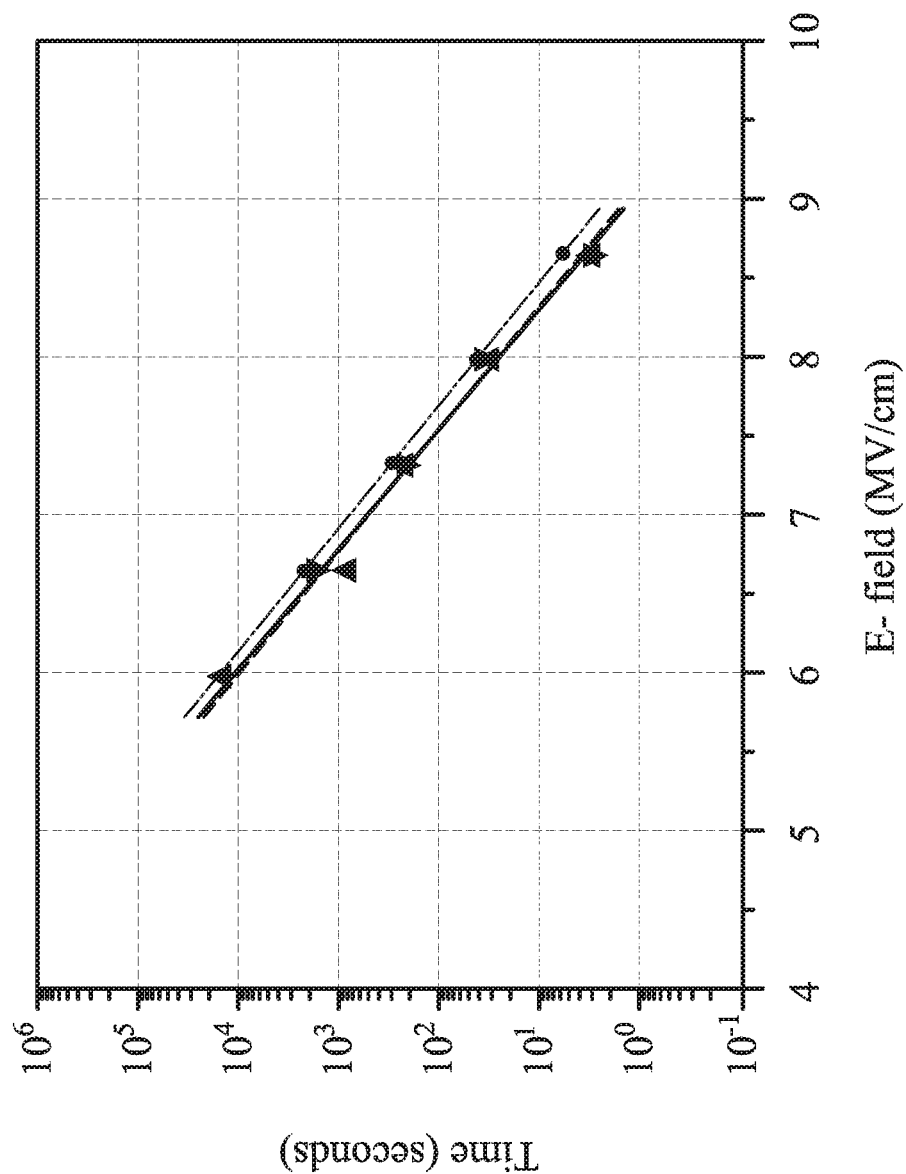
FIG. 10 is a graph illustrating a time to failure of samples as a function of electric field to illustrate time-dependent dielectric breakdown (TDDB) of the samples in accordance with some embodiments.

Some embodiments may achieve advantages. Some embodiments can obtain a decreased parasitic capacitance. The low-k dielectric layer 32 can achieve a lower k-value than other conventional dielectric layers. With a lower k-value, parasitic capacitance of devices interconnected using the metallization pattern (e.g., that includes the conductive fill material 54) can be decreased, such as by about 6% to 7%, for example. FIG. 8 is a graph illustrating capacitance per distance (femtofarad per micrometer (fF/μm)) as a function of inverse resistance (i/R) for a number of samples of an example low-k dielectric in accordance with some embodiments. The samples exhibited 6.7% reduced capacitance and reduced inverse resistance relative to samples formed with another low-k dielectric. The reduced parasitic capacitance can result in a reduced RC delay and increased device speed. Further, as described above, the low-k dielectric layer 32 can have increased hardness. The increased hardness may permit the low-k dielectric layer 32 to accommodate stresses in neighboring layers with less bending or warping. Hence, via induced bending (VIB) in the low-k dielectric layer 32 may be reduced. A reduction in VIB can improve gap fill for a metallization, which can in turn improve yield. Even further, the low-k dielectric layer 32 can be more robust, which can lead to improvements in voltage breakdown (VBD) and time-dependent dielectric breakdown (TDDB). FIG. 9 is a graph illustrating failure rates of samples as a function of voltage breakdown (VBD) in accordance with some embodiments. The samples fabricated in accordance with embodiments described herein exhibited increased VBD, such as by 1.5 V, relative to samples fabricated with another low-k dielectric layer. FIG. 10 is a graph illustrating a time to failure of samples as a function of electric field (E-field) to illustrate TDDB of samples fabricated in accordance with some embodiments. The samples fabricated in accordance with embodiments described herein exhibited improved TDDB, such as a 10 times improvement, relative to samples fabricated with another low-k dielectric layer. A low-k dielectric layer formed according to the illustrated and described examples can be advantageous in scaling small technology nodes, such as 5 nm and smaller, even though such a low-k dielectric layer may be applied in larger technology nodes.

An embodiment is a method. A dielectric is formed over a semiconductor substrate. The dielectric has a k-value equal to or less than 3.9. Forming the dielectric includes using a plasma enhanced chemical vapor deposition (PECVD). The PECVD includes flowing a diethoxymethylsilane (mDEOS, $C_5H_{14}O_2Si$) precursor gas, flowing an oxygen ($O_2$) precursor gas; and flowing a carrier gas. A ratio of a flow rate of the mDEOS precursor gas to a flow rate of the carrier gas is less than or equal to 0.2.

Another embodiment is a method. A dielectric layer is formed over a semiconductor substrate. An opening is formed through the dielectric layer. A conductive feature is formed in the opening through the dielectric layer. Forming the dielectric layer includes using a first plasma enhanced chemical vapor deposition (PECVD) that uses a first diethoxymethylsilane (mDEOS, $C_5H_{14}O_2Si$) precursor gas and a first carrier gas. During the first PECVD, a flow rate of the first mDEOS precursor gas is equal to or less than 600 sccm, and a flow rate of the first carrier gas is equal to or greater than 3,000 sccm.

A further embodiment is a structure. The structure includes a dielectric over a semiconductor substrate, and a conductive feature along a sidewall of the dielectric. The dielectric has a k-value less than or equal to 3.9. The dielectric has a carbon concentration, an oxygen concentration, and a silicon concentration. The carbon concentration is in a range from 5 atomic percent to 30 atomic percent. The oxygen concentration is in a range from 40 atomic percent to 55 atomic percent. The silicon concentration is in a range from 30 atomic percent to 40 atomic percent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a dielectric over a semiconductor substrate, wherein:
     the dielectric has a k-value less than or equal to 3.9;
     the dielectric has a carbon concentration, an oxygen concentration, and a silicon concentration;
     the carbon concentration is in a range from 5 atomic percent to 30 atomic percent, wherein the carbon concentration is consistent from a sidewall within the dielectric to a region of the dielectric away from the sidewall of the dielectric;
     the oxygen concentration is in a range from 40 atomic percent to 55 atomic percent; and
     the silicon concentration is in a range from 30 atomic percent to 40 atomic percent; and
   a conductive feature along said sidewall of the dielectric.

2. The structure of claim 1, wherein:
   the dielectric has a concentration of Si—C—Si bonds in a range from 8 percent to 50 percent; and
   the dielectric has a concentration of Si—$CH_3$ bonds in a range from 5 percent to 40 percent.

3. The structure of claim 1, wherein the dielectric has a hardness in a range from 3 Gpa to 10 GPa.

4. The structure of claim 1, wherein the oxygen concentration is greater than the silicon concentration, and the silicon concentration is greater than the carbon concentration.

5. The structure of claim 1 further comprising:
   an etch stop over the semiconductor substrate; and
   an adhesion layer over the etch stop, wherein:
     the dielectric is over the adhesion layer; and
     the conductive feature is along respective sidewalls of the adhesion layer and the etch stop.

6. The structure of claim 1, wherein the dielectric does not have pores.

7. A structure comprising:
   a first dielectric layer;
   a first conductive feature in the first dielectric layer;
   a dielectric structure over the first dielectric layer, the dielectric structure comprising:
     one or more etch stop layers;
     an adhesion layer over the one or more etch stop layers; and
     a second dielectric layer over the adhesion layer, wherein the second dielectric layer has a hardness between about 3 GPa and 10 GPa, wherein the second dielectric layer does not have pores, and wherein the second dielectric layer has a carbon concentration which is constant throughout the second dielectric layer; and
   a second conductive feature extending through the dielectric structure, the second conductive feature being electrically coupled to the first conductive feature.

8. The structure of claim 7, wherein the one or more etch stop layers comprise:
   a first etch stop layer on the first dielectric layer; and
   a second etch stop layer on the first etch stop layer.

9. The structure of claim 8, wherein the adhesion layer comprises an oxygen-containing layer.

10. The structure of claim 7, wherein the dielectric structure extends over at least a portion of the first conductive feature.

11. The structure of claim 7, wherein the second dielectric layer has a k-value equal to or less than 3.9.

12. The structure of claim 7, wherein the carbon concentration is in a range from 5 atomic percent to 30 atomic percent.

13. The structure of claim 12, wherein the second dielectric layer has an oxygen concentration in a range from 40 atomic percent to 55 atomic percent.

14. The structure of claim 13, wherein the second dielectric layer has a silicon concentration in a range from 30 atomic percent to 40 atomic percent.

15. The structure of claim 7, wherein the second dielectric layer has a silicon concentration in a range from 30 atomic percent to 40 atomic percent.

16. The structure of claim 7, wherein the second dielectric layer has an oxygen concentration that is greater than a silicon concentration, and the silicon concentration is greater than the carbon concentration.

17. A structure comprising:
    a first dielectric layer;
    a first conductive feature in the first dielectric layer;
    a second dielectric layer over the first dielectric layer, wherein the second dielectric layer has a hardness between about 3 GPa and 10 GPa, wherein the second dielectric layer comprises a carbon concentration in a range from 5 atomic percent to 30 atomic percent, an oxygen concentration in a range from 40 atomic percent to 55 atomic percent, and a silicon concentration is in a range from 30 atomic percent to 40 atomic percent, wherein the second dielectric layer has a concentration of Si—C—Si bonds in a range from 8 percent to 50 percent, and wherein the second dielectric layer has a concentration of Si—$CH_3$ bonds in a range from 5 Percent to 40 percent, wherein the second dielectric layer does not have pores; and
    a second conductive feature extending through the second dielectric layer, the second conductive feature being electrically coupled to the first conductive feature.

18. The structure of claim 17 further comprising:
one or more etch stop layers over the first dielectric layer; and
an adhesion layer over the one or more etch stop layers, wherein the one or more etch stop layers and the adhesion layer are interposed between the first dielectric layer and the second dielectric layer.

19. The structure of claim 17, wherein the carbon concentration is substantially consistent throughout the second dielectric layer.

20. The structure of claim 17, wherein the second dielectric layer has a dielectric constant less than or equal to 3.9.

* * * * *